United States Patent
Iida

(10) Patent No.: US 8,315,723 B2
(45) Date of Patent: Nov. 20, 2012

(54) RECORDING AND/OR REPRODUCING APPARATUS AND RECORDING APPARATUS

(75) Inventor: Kenichi Iida, Saitama (JP)

(73) Assignee: Sony Corporation, Tokyo (JP)

( * ) Notice: Subject to any disclaimer, the term of this patent is extended or adjusted under 35 U.S.C. 154(b) by 1309 days.

(21) Appl. No.: 11/242,472

(22) Filed: Oct. 3, 2005

(65) Prior Publication Data

US 2006/0047352 A1 Mar. 2, 2006

Related U.S. Application Data

(60) Continuation of application No. 09/804,008, filed on Mar. 12, 2001, now Pat. No. 7,127,306, which is a division of application No. 08/924,091, filed on Sep. 5, 1997, now Pat. No. 6,289,253.

(30) Foreign Application Priority Data

| Sep. 18, 1996 | (JP) | P08-246680 |
| Sep. 18, 1996 | (JP) | P08-246681 |
| Sep. 18, 1996 | (JP) | P08-246686 |

(51) Int. Cl.
   *G06F 17/00* (2006.01)
   *G10L 11/00* (2006.01)
(52) U.S. Cl. ............. 700/94; 381/61; 704/270; 704/278
(58) Field of Classification Search .......... 700/94; 704/270, 272, 278; 360/32, 55; 369/31.01, 369/63
   See application file for complete search history.

(56) References Cited

U.S. PATENT DOCUMENTS

| 4,791,741 A | 12/1988 | Kondo |
| 5,121,269 A | 6/1992 | Tsuchida et al. |
| 5,226,090 A | 7/1993 | Kimura |
| 5,491,774 A | 2/1996 | Norris et al. |
| 5,499,316 A | 3/1996 | Sudoh et al. |
| 5,508,984 A | 4/1996 | Goto |
| 5,577,918 A | 11/1996 | Crowell |
| 5,687,242 A | 11/1997 | Iburg |
| 5,774,863 A * | 6/1998 | Okano et al. .................. 704/278 |
| 5,841,878 A | 11/1998 | Arnold et al. |

(Continued)

FOREIGN PATENT DOCUMENTS

DE 4207447 A1 9/1993

(Continued)

*Primary Examiner* — Xu Mei

(74) *Attorney, Agent, or Firm* — Oblon, Spivak, McClelland, Maier & Neustadt, L.L.P.

(57) ABSTRACT

A recording and/or reproducing apparatus includes a microphone, a semiconductor memory, an operating section and a controller. An output signal from the microphone is written in the semiconductor memory and the written signals are read out from the semiconductor memory. The operating section performs input processing for writing a digital signal outputted by an analog/digital converter, reading out the digital signal stored in the semiconductor memory and for erasing the digital signal stored in the semiconductor memory. The control section controls the writing of the microphone output signal in the semiconductor memory based on an input from the operating section and the readout of the digital signal stored in the semiconductor memory. The control section operates so that, if, when the signals written in the storage section is read out from it, an input for erasure is entered by the operating section, the signal being read out from the storage section is erased when, after reading out the signal from the storage section for a pre-set period, an input for erasure is again entered from the operating section.

25 Claims, 8 Drawing Sheets

U.S. PATENT DOCUMENTS

| | | |
|---|---|---|
| 5,842,170 A | 11/1998 | Daberko et al. |
| 5,870,710 A | 2/1999 | Ozawa et al. |
| 5,903,868 A | 5/1999 | Yuen et al. |
| 6,031,915 A | 2/2000 | Okano et al. |
| 6,041,416 A | 3/2000 | Lada, Jr. |
| 6,055,500 A | 4/2000 | Terui et al. |
| 6,055,550 A | 4/2000 | Wallack |
| 6,289,253 B1 | 9/2001 | Iida |
| 6,321,129 B1 | 11/2001 | D'Agosto, III |
| 6,442,443 B1 | 8/2002 | Fujii et al. |
| 6,615,294 B1 | 9/2003 | Yamanoi |
| 6,975,912 B1 * | 12/2005 | Iida ................... 700/94 |
| 7,127,306 B2 * | 10/2006 | Iida ................... 700/94 |

FOREIGN PATENT DOCUMENTS

| | | |
|---|---|---|
| EP | 0209047 A2 | 1/1987 |
| JP | S 64-052198 A | 2/1989 |
| JP | H 01-173409 A | 7/1989 |
| JP | H 05-062102 A | 3/1993 |
| JP | H 06-350949 A | 12/1994 |
| JP | H 08-115100 A | 5/1996 |
| JP | H 08-154124 A | 6/1996 |
| JP | H 08-205014 A | 8/1996 |

* cited by examiner

RECORDING AND/OR REPRODUCING APPARATUS AND RECORDING APPARATUS

CROSS-REFERENCE TO RELATED APPLICATIONS

This application is a continuation of application Ser. No. 09/804,008 filed Mar. 12, 2001, now U.S. Pat. No. 7,127,306 the disclosure of which is hereby incorporated by reference herein, which is a division of application Ser. No. 08/924,091 filed Sep. 5, 1997, now U.S. Pat. No. 6,289,253, and claims priority from Japanese Application Nos. P08-246686 filed on Sep. 18, 1996, P08-246680 filed on Sep. 18, 1996 and P08-246681 filed on Sep. 18, 1996.

BACKGROUND OF THE INVENTION

1. Field of the Invention

This invention relates to a recording and/or reproducing apparatus and a recording apparatus. More particularly, it relates to a recording and/or reproducing apparatus and a recording apparatus employing a semiconductor memory as a recording medium.

2. Description of the Related Art

As a sound recording device, a tape recorder, a digital audio tape recorder (DAT) or a device employing a magneto-optical disc, is in widespread use. If, in these recording devices, recorded audio data, for example, is erased from the recording medium, the user designates an address of desired audio data and presses an erasure button for erasing the audio data.

In erasing the pre-set information signal from the recording medium, the contents of erasure cannot be confirmed once the erasure button is pressed, such that there is a risk of inadvertent erasure of the information signal not desired to be erased by the user.

SUMMARY OF THE INVENTION

It is therefore an object of the present invention to provide a recording and/or reproducing device which resolves the above-mentioned problems.

It is another object of the present invention to provide a recording device which resolves the above-mentioned problems.

According to the present invention, there is provided a recording and/or reproducing apparatus includes a microphone, a storage section, an operating section and a controller. An output signal from the microphone is written in the storage section and the written signals are read out from the storage section. The operating section performs input processing for writing a digital signal outputted by an analog/digital converter, reading out the digital signal stored in the storage section and for erasing the digital signal stored therein. The control section controls the writing of the microphone output signal in the storage section based on an input from the operating section and the readout of the digital signal stored in the storage section. The control section operates so that, if, when the signals written in the storage section is read out from it, an input for erasure is entered by the operating section, the signal being read out from the storage section is erased when, after reading out the signal from the storage section for a pre-set period, an input for erasure is again entered from the operating section.

According to the present invention, there is also provided a recording and/or reproducing apparatus including a microphone, a storage section, a detection mechanism and a control section. An output signal of the microphone and management data for managing the output signal are written in the storage section. The detection mechanism detects that a lid for opening/closing the battery housing section has been moved to a position of opening the battery housing section. The controller controls writing of the microphone output signal in the storage section. On detecting the movement by the detection mechanism of the lid to a position of opening the battery housing section, the control section manages control for stopping the writing of the microphone output signal in the storage section and for writing the write-inhibited microphone output signal in the storage section.

According to the present invention, there is also provided a recording and/or reproducing apparatus including a microphone, a storage section, a detection mechanism and a control section. An output signal of the microphone and management data for managing the output signal are written in the storage section. The operating section performs input processing for writing a digital signal outputted by an analog/digital converter, reading out the digital signal stored in the storage section and for erasing the digital signal stored in the storage section. The illuminating section illuminates the display section. The control section controls the writing of the microphone output signal in the storage section and readout of the signal stored in the storage section based on an input from the operating section. The control section also causes the illuminating section to illuminate the display section based on an input from the operating section.

DESCRIPTION OF THE INVENTION

Figure 1:
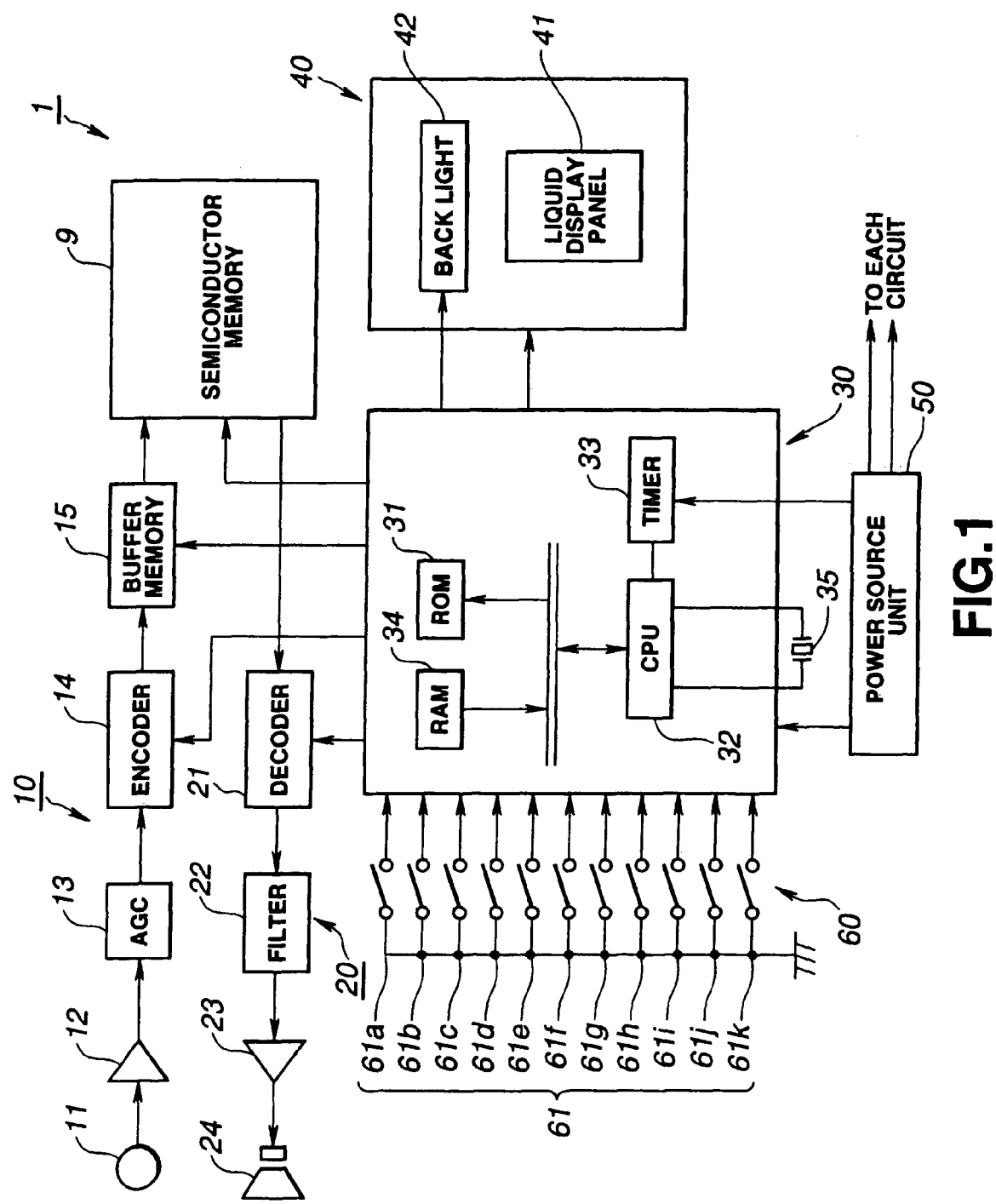
FIG. 1 is a block diagram showing the structure of an IC recorder embodying the present invention.

Referring to the drawings, the recording and/or reproducing device of the present invention will be explained in detail. In explaining the recording and/or reproducing device according to the present invention, a recording and/or reproducing employing a semiconductor storage as a recording medium and designed for storing the speech in the semiconductor storage, referred to herein as an IC recorder, is taken as an example.

Referring to FIG. 1, the IC recorder 1 includes a recording section 10 for converting an output signal from a microphone 11 into audio data for storage in a semiconductor memory 9 and a reproducing section 20 for reading out the speech data stored in the semiconductor memory 9 for conversion into an audio signal for driving a speaker 24. The IC recorder 1 also includes a controller 30 for controlling for example the recording section 10, a power source section 50 for supplying power to for example the controller 30 and an operating section 60 for the user to perform various operations.

Referring to FIG. 1, the recording section 10 includes an amplifier 12 for amplifying an output signal from the microphone 11 and an automatic gain controller (AGC) for adjusting the level of the output signal amplified by the amplifier 12 to an appropriate level. The recording section 10 also includes an encoder 14 for converting an output signal of the AGC 13 into audio data and a buffer memory 15 for delaying the audio data from the encoder 14.

The microphone 11 converts an input speech into electrical signals which are then supplied to the amplifier 12. The amplifier 12 amplifies the audio signal which are routed to the AGC 13. The AGC 13 amplifies the audio signal amplified by the amplifier 12 to an appropriate level and routes the resulting signal to the encoder 14.

Since the audio signal exhibits strong correlation, the encoder 14 encodes the audio signal with a small data volume by for example an adaptive differential pulse code modulation (ADPCM) for generating audio data which is supplied to the buffer memory 15.

The buffer memory 15 has a capacity corresponding to a pre-set delay time and delays the audio data supplied from the encoder 14 a pre-set time to supply the delayed data to the semiconductor memory 9. The buffer memory 15 is used for preventing recording on the memory 9 of the noise generated at the time of switching of a contact of a switch actuated on pressing a pushbutton as later explained.

The semiconductor memory 9 is comprised of a non-volatile semiconductor memory, such as an electrically erasable programmable read-only memory (EEPROM) in which the stored contents of the memory device are not erased but held even if the driving power source of the memory is turned off. The semiconductor memory 9 stores the audio data supplied from the buffer memory 15 as well as audio data specifying in which area the audio data has been stored. Specifically, the semiconductor memory 9 has a capacity of for example 16 MBytes such that it can store 8 minutes of audio data corresponding to the speech of 200 to 3400 Hz in a SP mode as later explained while it can store 16 minutes of audio data corresponding to the speech of 200 to 1700 Hz in an LP mode.

The reproducing section 20 has a decoder 21 and a filter 22 for converting speech data read out from the semiconductor memory 9 into so-called PAM signal and an amplifier 23 for amplifying the audio signal from the filter 22 for supplying the amplified audio signal to a speaker 24, as shown in FIG. 1.

The decoder 21 is a counterpart of the encoder 14 of the recording section 10 and decodes the audio data read out from the semiconductor memory 9, that is the audio data encoded in accordance with the ADPCM system, for generating so-called PAM signal. The filter 22 removes high-frequency components higher than the audio range from the PAM signal to output an audio signal. The amplifier 23 amplifies the audio signal supplied from the decoder 21 for driving the speaker 24. In this manner, the recorded speech is outputted from the speaker 24.

Referring to FIG. 1, the controller 30 includes a ROM 31 having stored therein a program for controlling the operation of the IC recorder 1, and a micro-computer (CPU) 32 for executing the program stored in the ROM 31 for controlling the semiconductor memory 9 or the recording section 10. The controller 30 also includes a timer 33 for measuring the time and a random access memory (RAM) 34 for temporarily storing time or the results of program execution.

The controller 30 is supplied with the signal from a variety of pushbuttons 61 of the operating section 60. If any one of plural pushbuttons 61 is pressed, the program associated with the pushbutton 61 is read out from the ROM 31 and executed for controlling various parts. If for example a recording start button 61k is pressed, the CPU 32 reads out and executes the program associated with the recording from the ROM 31 for actuating the amplifier 12, AGC 13 or the encoder 14 for performing control such that audio data delayed a pre-set time by the buffer memory 15 will be written and stored in a vacant area of the semiconductor memory 9 for prohibiting recording of the noise generated on actuation of the pushbutton 61.

The controller 30 controls the writing and readout of audio data on or from the semiconductor memory 9 such that it performs control of affixing index numbers for identifying 99 audio data in two files A and B of the semiconductor memory 9 and writing the audio data and the index numbers and reading out the audio data in accordance with the index numbers. A quartz oscillator 35 for actuating the timer 33 is connected to the semiconductor memory 9 for reading out the audio data recorded on the semiconductor memory 9 at pre-set time. A display panel 40 is also connected to the controller 30 such that the CPU 32 displays the operating state or the operating sequence for the IC recorder 1 on the display section 40. The display section 40 includes a liquid display panel 41 of low power consumption and a back-light 42 for illuminating the liquid display panel 41. If, for example, a menu/feed button 61a of the operating section 60 is pressed, the CPU 60 sequentially displays the date and time on the display section 40 so that the user can check the display for setting the timer 33. The operation of the back-light 42 will be explained subsequently.

If the state of pressing of a lid opening detection switch 55 is nullified during the recording operation, the CPU 32 reads out and executes the program of terminating the recording operation or the reproducing operation and the program of writing the TOC information from the RPM 31 for terminating the operation of recording or reproduction and for simultaneously storing the management information specifying in which area the written audio data has been recorded. If the pressed state of the lid opening detection switch 55 is nullified, the CPU 32 reads out from the ROM 31 the program of switching from the usual power consumption mode to the low power consumption mode as later explained and executes the read-out program for effecting mode switching processing.

Figure 2:
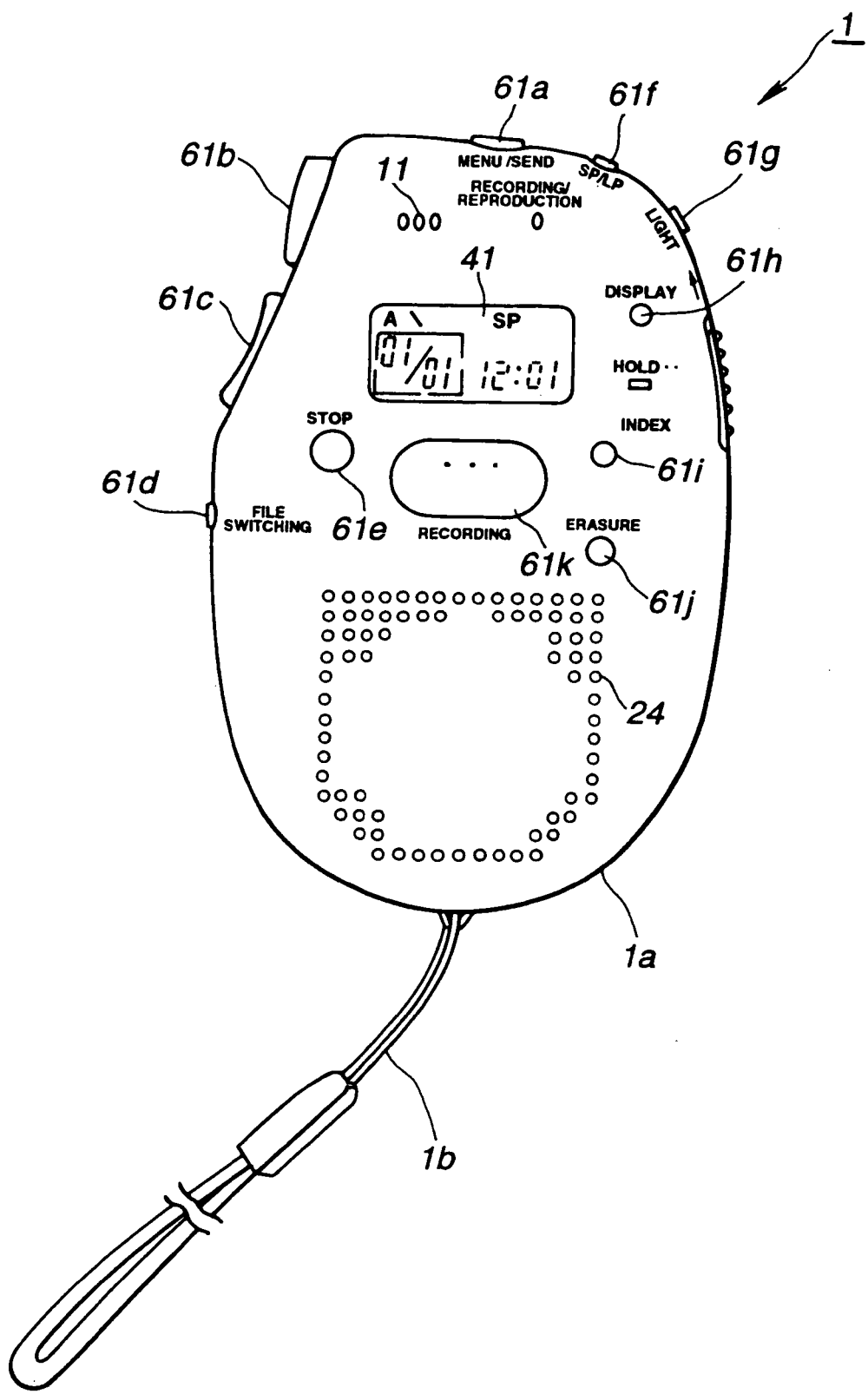
FIG. 2 is a front view showing the structure of an IC recorder embodying the present invention.
Figure 3:
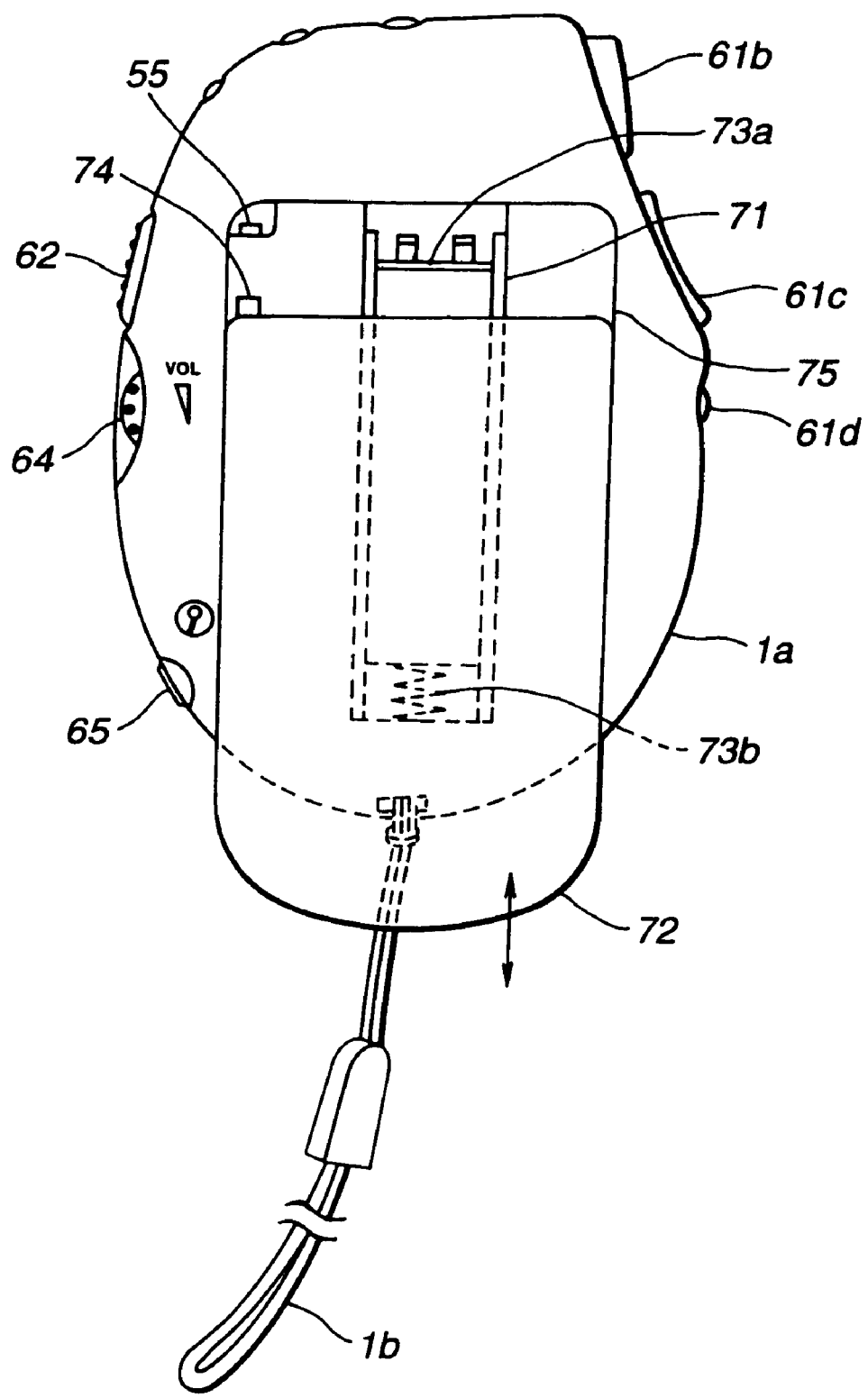
FIG. 3 is a back view showing the structure of an IC recorder embodying the present invention.

Referring to FIGS. 2 and 3, the operating section 60 is explained in detail. The IC recorder 1 shown in FIGS. 2 and 3 is portable and has an outer casing of the size of the palm within which is mounted a printed circuit board carrying electrical circuits such as the above-mentioned recording section 10 and the reproducing section 20. The IC recorder 1 is shaped so as to be held easily with left hand so that the recorder can be used in conjunction with the usual writing operation with the right hand. On the outer casing 1a are mounted plural pushbuttons 61 constituting the operating section 60. On the outer casing 1a is mounted a hand strap used for transportation of the IC recorder 1 as shown in FIG. 2.

The operating section 60 includes a menu-feed button 61a, a playback button 61b for starting the reproduction and a return/feed button 61c for setting the index numbers. The operating section 60 also includes a file switching button 61d for file switching, a stop button 61f for stopping the recording and an SP/LP button 61f for switching between the SP mode and the LP mode. The operating section 60 also includes a light button 61g for lighting the back-light 42, a display button 61h and an index button 61i for setting the index. The operating section 60 ultimately includes an erasure button 61j for erasing the audio data stored in the semiconductor memory 9 and a recording start button 61k for starting the recording.

Of these operating buttons, the playback button 61b and the return/feed button 61c, used often, are mounted on a lateral side of a cut-out formed on an upper left portion of the outer casing 1a, as shown in FIG. 2, for permitting facilitated operation of these buttons with the left thumb finger. The recording start button 61k, also used often, is constituted by a pushbutton of a larger size mounted on the major surface of the outer casing 1a for permitting facilitated operation of these buttons with the left thumb finger.

The operating section 60 also has a holding switch 62, a recording and/or reproducing lamp 63 indicating that recording or reproduction is going on, a volume 64 for adjusting the loudness of the reproduced sound and an earphone jack 65. The recording and/or reproducing lamp 63 is mounted on the major surface of the outer casing 1a for facilitating visual inspection during use. The holding switch 62, volume 64 and the earphone jack 65, used less often, are mounted on the lateral side of the outer casing 1a.

On the major surface of the outer casing 1a are mounted the above-mentioned microphone 11, speaker 24 and so forth. For reducing the size of the IC recorder 1 for improving portability of the IC recorder 1, the microphone 11 and the recording start button 61k are mounted close to each other.

Figure 4:
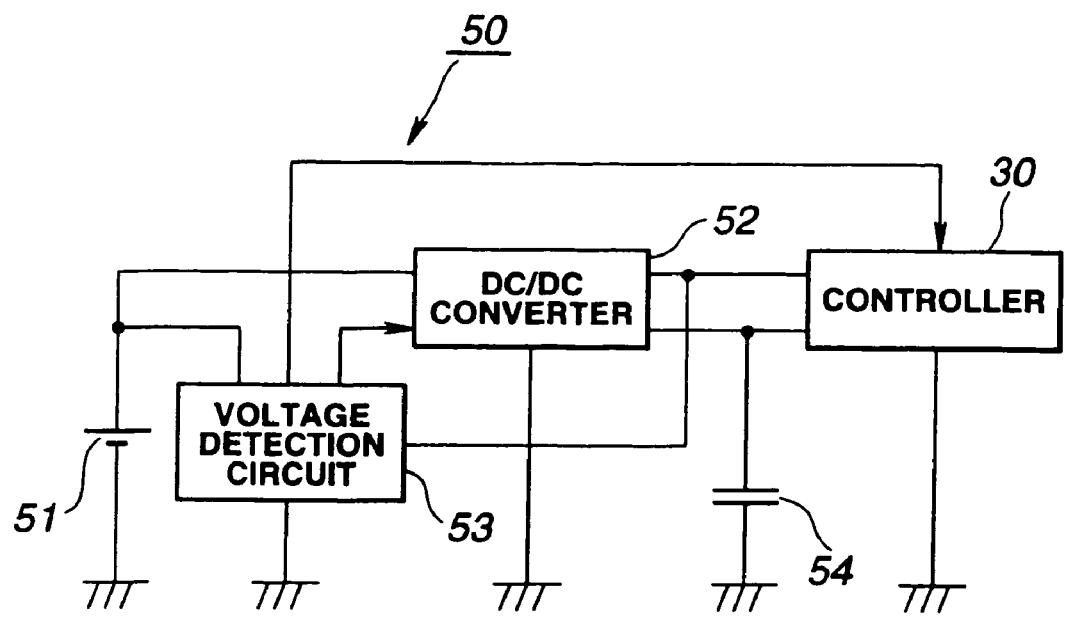
FIG. 4 is a block diagram showing the structure of a power source circuit of the IC recorder.

The power source section 50 is now explained. Referring to FIG. 4, the power source section 50 includes a battery 51, a DC/DC converter 52 for raising the output voltage of the battery 51 and a voltage detection circuit 53 for detecting the output voltage of the battery 51. The power source section 50 also includes a capacitor 54 charged by the output voltage of the DC/Dc converter 52 and a lid opening detection switch 55 for detecting the opening of the battery holding spacing.

The IC recorder 1 is of the size of a palm for facility in transportation, as described above. This battery 51, a sole 'tan-4' dry cell for reducing the size of the device, is housed in a battery housing spacing 71 of a size to hold the 'tan-4' dry cell formed in the back surface of the outer casing 1a, as shown in FIG. 3. The battery housing spacing 71 is closed by a lid 72. In the battery housing spacing 71 are mounted connection pieces 73a, 73b associated with the plus and minus sides of the battery 51, respectively. When the battery 51 is housed in the battery housing spacing, the connection pieces 73a, 73b are connected to the battery 51 so that the current is supplied to the circuitry of the IC recorder 1.

The DC/DC converter 52 raises the output voltage of the battery 51, that is 1.5V, to a voltage necessary for operating the circuitry of the amplifiers 12, 23 or the CPU 32 for supplying the current of the voltage to the circuitry of the IC recorder 1.

The voltage detection circuit 53 detects the output voltage of the battery 51 for stopping the operation of the DC/DC converter 52 when the output voltage of the battery 51 is equal to for example 50 V. Thus, the power stored in the battery 51 is not consumed after its output is equal to the pre-set value of for example 0.8 V. That is, even if the DC/DC converter 52 is used, the voltage of the battery 51 can be prevented from being thereby suddenly lowered, thus preventing liquid leakage from occurrence.

The capacitor 54 is a so-called back-up capacitor connected between the ground and a power source line to which are connected only the DC/DC converter 52 and the timer 33 of the controller 30. That is, if the DC/DC converter 52 is in operation, that is if the mode is the usual power consumption mode, the device is operated by the current supplied from the DC/DC converter 52, whereas, if the DC/DC converter 52 is halted as when the output voltage of the battery 51 is lowered or when the battery 51 is taken out for battery exchange, that is if the mode is the low power consumption mode, the device is operated by the current from the capacitor 52. The possible back-up time of the capacitor 54 is for example approximately 3 minutes.

The lid-opening detection switch 55 is used for detecting the opened state of the lid 72. Referring to FIG. 3, the switch 55 is provided laterally of the battery housing spacing 71. If the lid 72 is closed, the switch can be pressed by a protrusion 74 provided on the lid 72. If the user moves the lid 72 in a direction of opening the spacing 71 relative to the outer casing 1a, the thrust state by the protrusion 74 is nullified, so that a signal specifying the opened state of the lid 72 is furnished to the controller 30.

More specifically, the protrusion 74 is formed on one end of the lid and retainers, not shown, are formed on left and right lateral sides of the lid 72. On the back side of the outer casing 1a is formed a shoulder 75 for surrounding the battery housing spacing 71. On the left and right lateral sides of the shoulder 75 are formed retention recesses, not shown. By fitting the retainers on the left and right lateral sides of the shoulder 75 in the retention recesses in the left and right lateral sides of the shoulder 75, the lid 72 is movably mounted on the outer casing 1a for opening or closing the spacing 71.

The opening/closure of the lid 72 is achieved by the user sliding the retainers along the retention recesses. If the lid 72 remains closed, the lid opening detection switch 55 is in the pushed-in state by the protrusion 74, such that, when the lid 72 is slid and opened, the thrust state of the switch by the protrusion 74 is nullified. In this nullified state, a signal specifying the opened state of the lid 72 is supplied to the controller 30.

Figure 5:
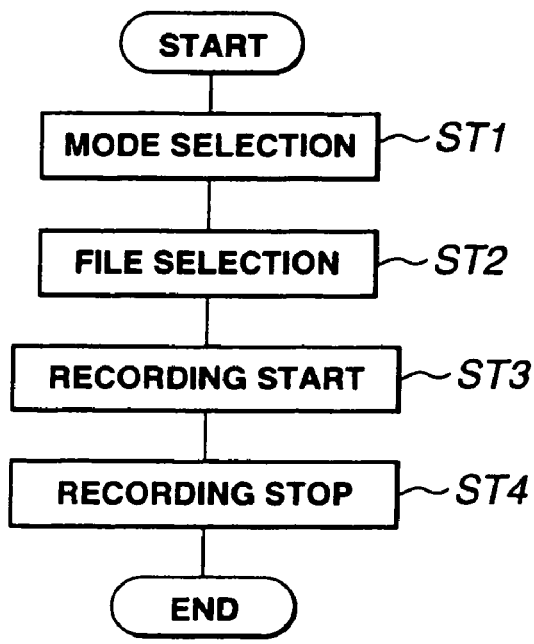
FIG. 5 is a flowchart showing the recording operation of the IC recorder.

Referring to FIG. 5, the sequence of operations for recording the speech in the above-described IC recorder 1 is as follows: First, at step ST1, the SP/LP button 61f is pressed for selecting whether the recording system is in the LP mode or in the SP mode. The indications 'SP' or 'LP' appear on the liquid display panel 41. Then, at step ST2, the file switching button 61d is pressed for selecting the file 'A' or 'B' provided in the semiconductor memory 9. The selected file name is displayed on the liquid display panel 41.

If then the recording start button 61k is pressed at step ST3, the recording/reproducing lamp 63 is lighted and the recording state is initiated. If the user speaks over the microphone 11, audio data is written in a specified area of the semiconductor memory 9. The stop button 61e is pressed at step ST4 for extinguishing the recording/reproducing lamp 63 for nullifying the recording state. At this time, not only the audio data but also the TOC information, file number and the recorded speech data are recorded in the semiconductor memory 9. If the user desires to record additional audio data, the audio data is recorded in the area similar to that of the initially set mode and file with the index number next to the initially accorded index number provided that the recording of such additional data is directly after recording of the initial speech data. That is, the mode selection and file selection operations of the steps ST1 and ST2 can be omitted.

Figure 6:
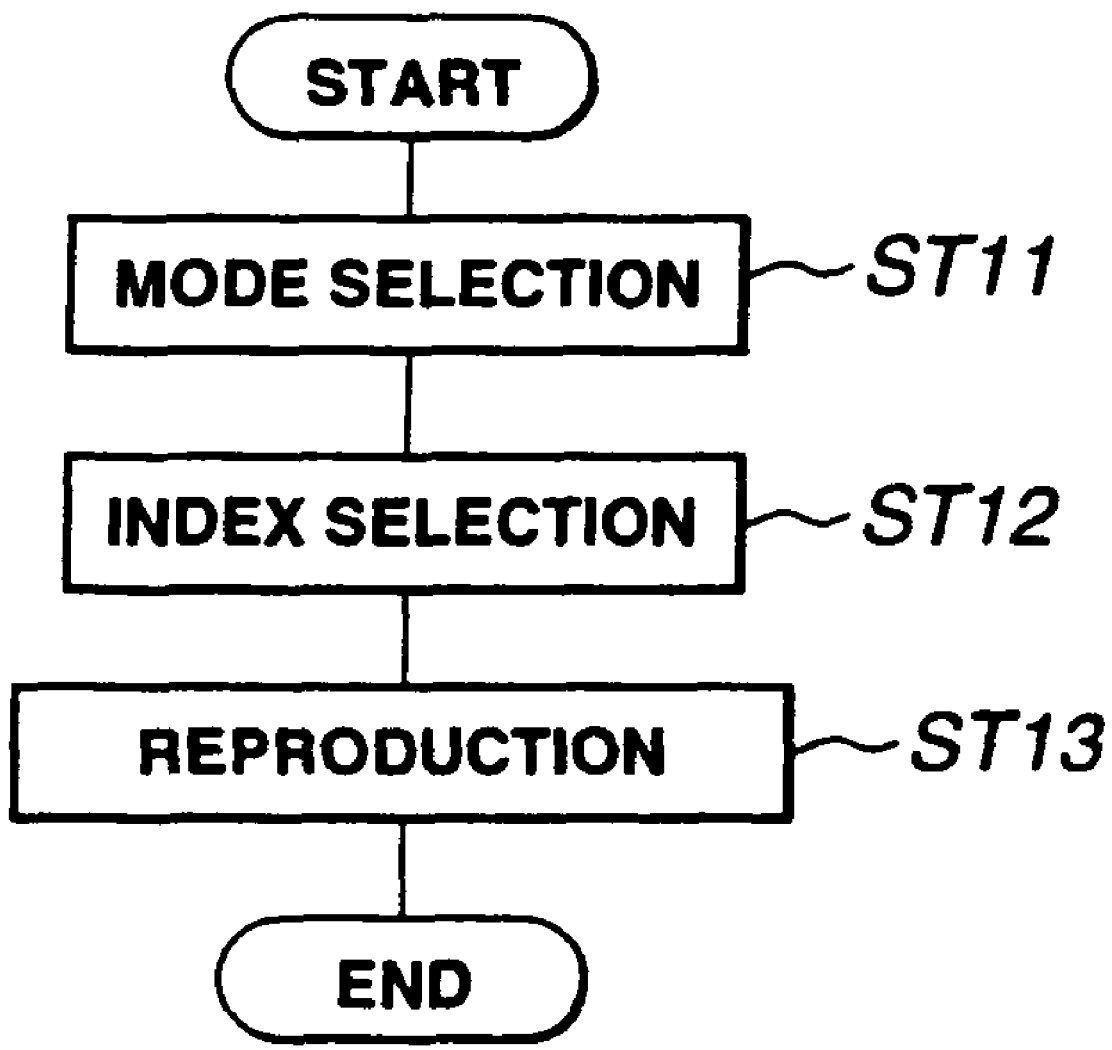
FIG. 6 is a flowchart showing the reproducing operation of the IC recorder.

Referring to FIG. 6, the sequence of operations for reproducing the recorded speech data is as follows: First, at step ST11, the file switching button 61d is pressed. This selects the file 'A' or 'B' provided on the semiconductor memory 9 and the selected file is displayed on the liquid display panel 41. At step ST12, the return/feed button 61c is pressed for selecting the desired index number recorded on the semiconductor memory 9. At step ST13, the playback button 61b and the recording/reproducing lamp 63 are lighted and the audio data desired by the user is reproduced. If the reproducing operation by the IC recorder 1 is to be stopped, the stop button 61*e* is pressed to stop the reproducing operation, with the recording/reproducing lamp 63 being turned off. If desired to proceed or revert to the next item, the return/feed button 61*c* is pressed, while the reproducing or recording operation is not going on, in order to select and reproduce the next or previous index number.

Figure 7:
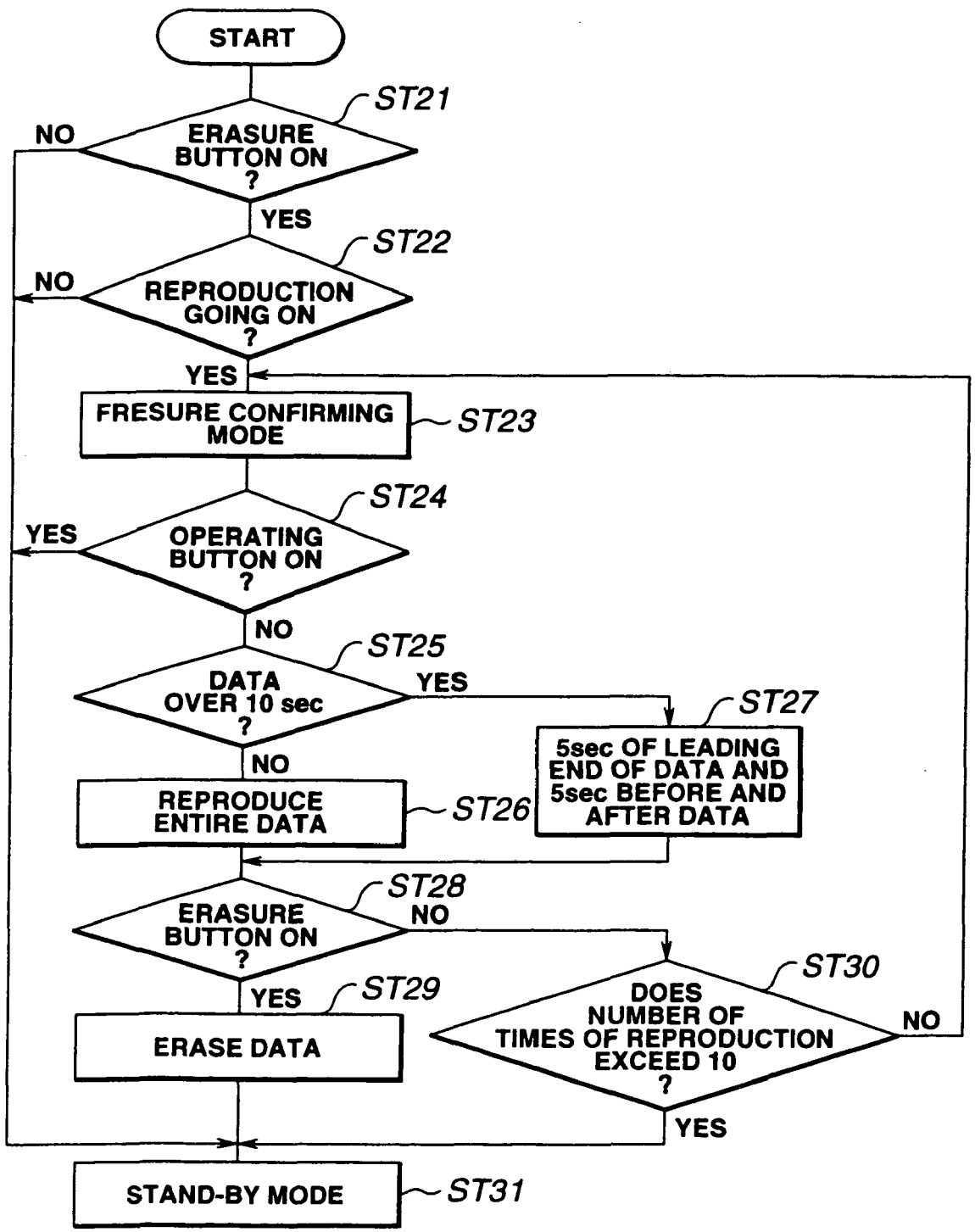
FIG. 7 is a flowchart showing the erasure operation of the IC recorder.

Referring to FIG. 7, the sequence of operations for erasing the recorded audio data from the semiconductor memory 9 is as follows; If, at step ST21, the erasure button 61*j* is pressed, with the audio data being reproduced as shown in FIG. 6, processing transfers to step ST22 where the CPU 32 judges whether or not audio data selected by the user is being reproduced. If the erasure button 61*j* is not pressed, processing transfers to step ST31 to set a stand-by mode corresponding to the absence of the recording/reproducing operations. If, at step ST22, the audio data is being reproduced, processing transfers to step ST23 to set the erasure confirming mode. In this erasure confirming mode, an indication 'ERASE' appears on the liquid display panel 41 in order for the user to recognize that the mode is the erasure confirming mode.

If the erasure confirming mode is set at step ST23, it is judged at step ST24 by the CPU 32 whether or not an operating button 61 other than the erasure button 61*j* has been pressed. If, in this erasure confirming mode state, the stop button 61*e* is pressed, processing transfers to step ST31 to set the stand-by state. If the operating buttons other than the stop button 61*e*, such as the reproducing button 61*k* or the recording start button 61*k*, are pressed, processing transfers similarly to step ST31 to set the stand-by mode. With the present IC recorder 1, if the user has pressed the operating button 61 other than the stop button 61*e* in the erasure confirming mode by error, the mode is set to the stand-by mode of step ST31 to prevent inadvertent erasure of the audio data.

If the operating button 61 has not been pressed at step ST24, processing transfers to ST25 for judging whether or not the audio data specified by the user and currently being reproduced continues for 10 seconds or longer. If the reproduced data continues for shorter than 10 seconds, processing transfers to step ST26 where the audio data in its entirety is reproduced. If the audio data has a duration less than 10 seconds, processing transfers to step ST27 where the leading 5 second portion and the trailing 5 second portion of the audio data being reproduced are reproduced. By reproducing the audio data to be erased in its entirety at ST26 and by reproducing the beginning 5 second portion and the trailing 5 second portion of the audio data at step ST27, the user can confirm the audio data to be erased.

If, as the audio data is being reproduced at steps ST26 or ST27, the erasure button 61*j* is again pressed at step ST28, processing transfers to step ST29 where the CPU 32 causes the erasure program stored in the RAM 34 to be executed for erasing the pre-set audio data recorded in the semiconductor memory 9. If, when four items of speech data are recorded in the file 'A' and accorded the index numbers of from 1 to 4, the audio data corresponding to the index number 3 is erased, the audio data corresponding to the index number of 4 is newly accorded the index number '3'. That is, if plural items of audio data are accorded with index numbers, and an item disposed in the midst of the plural audio data, the index numbers are padded to compensate for erasure.

If the audio data is erased, processing transfers to step ST31 to set the stand-by mode. If, at step ST28, the erasure button 61*j* has not been pressed, processing transfers to step ST30 for again reproducing the audio data in order for the CPU 32 to judge whether or not the number of times of playback has exceeded 10. If the audio data has not been reproduced by more than ten times, processing reverts to ST3 to maintain the erasure confirming mode. If, at step ST10, the audio data has been reproduced by more than ten times, processing transfers to step ST11 to set the stand-by mode.

The above description has been directed to erasure of audio data items one-by-one from the semiconductor memory 9. If desired to erase the recorded audio data in its entirety, the file switching button 61*d* is selected for selecting the file 'A' or 'B' and subsequently both the erasure button 61*j* and the stop button 61*e* are pressed simultaneously. Thus, the IC recorder 1 performs the complex operation of pressing the erasure button 61*j* and the stop button 61*e* simultaneously for evading inadvertent erasure of the entire audio data recorded in the file 'A' or 'B'.

With the above-described IC recorder 1, since the audio data desired by the user to erase from the semiconductor memory 9 is reproduced after the erasure button 61*j* is pressed to set the erasure confirming mode, it becomes possible to prevent inadvertent erasure of all audio data recorded in the file 'A' or 'B'. If the if the audio data to be erased continues for more than 10 seconds, only the beginning 5-second portion and the trailing 5 second portion of the audio data as required for confirming the audio data are reproduced, it becomes possible to erase the audio data easily without the audio data being reproduced for more than the required time. Also, the IC recorder 1 can proceed from the erasure confirming mode to the standby mode even if the recording start button 61*k* or the playback button 61*b* are pressed in addition to the stop button 61*e* with the erasure confirming mode, thus preventing mistaken erasure of audio data.

If the IC recorder 1 is dropped by careless handling by the user during recording such that the lid 72 is moved under the shock of descent in a direction of opening the spacing 71 to dismount the battery 51, the lid opening detection switch 55 detects such opening of the lid 72 to supply the corresponding detection signal to the controller 30. If a signal specifying the opening of the lid 72 is sent to the controller 30 of the IC recorder 1, the controller 30 causes the recording operation to be terminated while causing the TOC information to be written for specifying in which area the written audio data has been stored. Thus, with the present IC recorder 1, if the current supply from the battery 51 suddenly ceases during recording by some reason or other, audio data can be read out based on the written TOC information to reproduce the recorded speech.

If the signal specifying the opening of the lid 72 is supplied to the IC recorder 1, the mode is switched from the usual power consumption mode to the low power consumption mode such as after termination processing of the recording operation. The low power consumption mode means the power mode in which the recording or reproducing operation ceases and no indication is made on the liquid display panel 41 with only the timer 33 operating by the power supplied by the capacitor 54 only for time counting.

Figure 8:
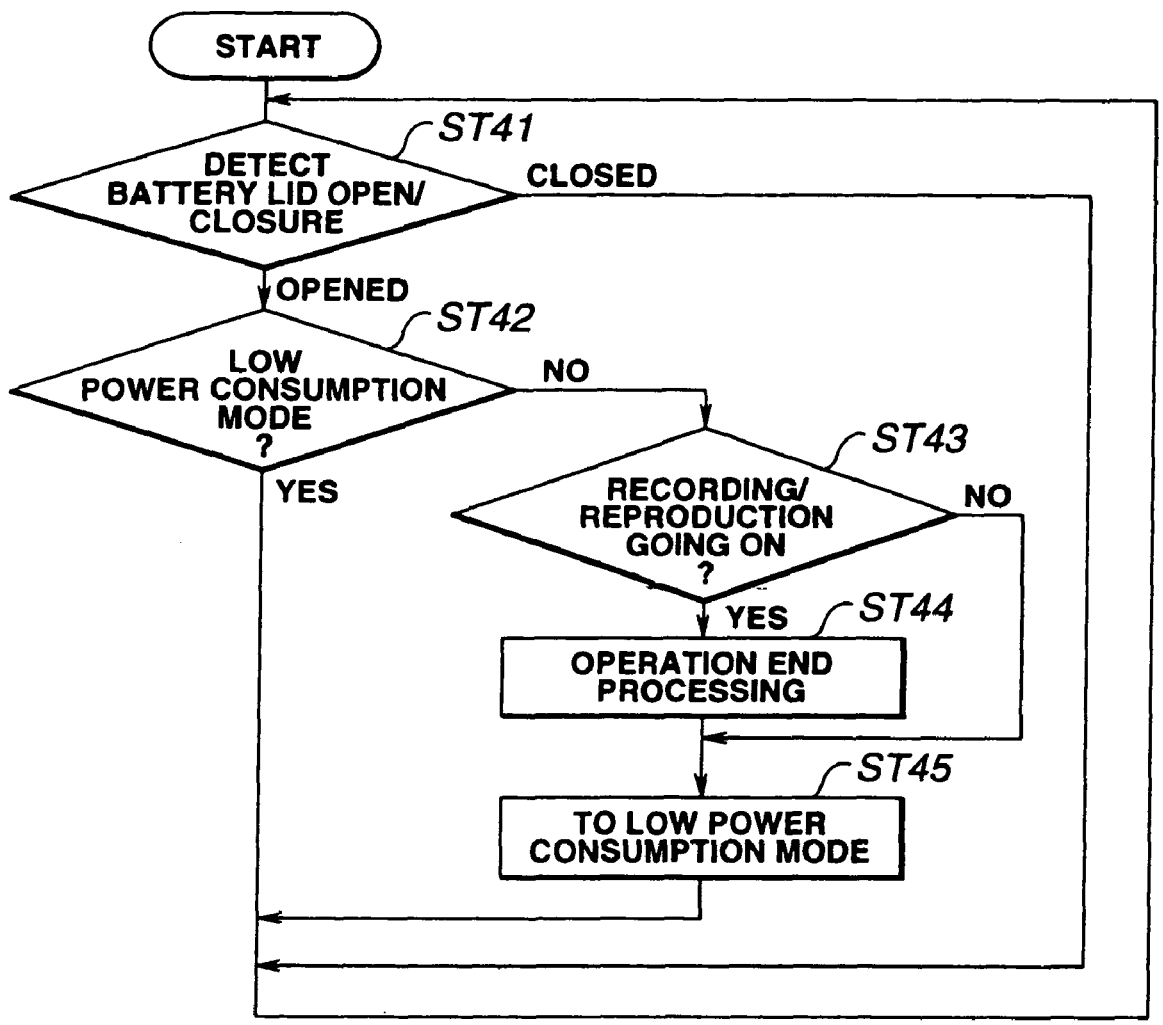
FIG. 8 is a flowchart showing the change of the operating mode of the IC recorder.

The power mode selection for the IC recorder 1 is selected as shown in FIG. 8. that is, it is first checked at step 41 whether or not the lid 72 of the battery housing spacing 71 is opened. If the lid 72 is opened, it is checked at step 42 whether or not the low power consumption mode is set. If the low power consumption mode is not set, that is if the mode is the usual power consumption mode, it is checked at step 43 whether or not the operation such as recording or reproduction is going on. If the operation such as recording or reproduction is going on, the operation end program is read out from ROM 31 to carry out the operation end processing. Simultaneously with the operation end processing, the TOC information writing program is read out from the ROM 31 to execute the TOC information writing at step 44. When these processing operations come to a close, the mode is switched from the usual power consumption mode the low power consumption mode at step 45. If the recording or reproducing operation is not going on at step 3, the processing at step 3 is not made but the mode is immediately switched from the usual power consumption mode to the low power consumption mode.

With the IC recorder 1, the mode is switched in this manner to the low power consumption mode, so that, if the battery 51 is dismounted by error and hence current supply from the battery ceases suddenly, the power supply from the capacitor 54 is sustained, with the result that time counting by the timer 33 can be continued by the power supplied from the capacitor 54 to cause no disorder in time counting. The normal function can be restored by mounting the battery 51 again in position within three minutes within which the back-up power of the capacitor 54 is sustained.

With the IC recorder 1, if the battery 51 is dismounted by error during recording to interrupt recording, the battery 51 can again be loaded in position and the lid 72 of the battery housing spacing 71 closed. At this time, the signal from the lid opening detection switch 55 ceases. However, programming can be made so that the index number corresponding to the recorded contents is automatically selected at this time for reproducing the audio data directly previous to the stop of recording. The recorded data is not limited to audio data but may also be dynamic data such as moving picture data.

On the liquid display panel 41 of the IC recorder 1, data and time are displayed based on an output of the timer 33. For setting this function, the menu/feed button 61a is first pressed. This displays the data on the liquid display panel 41 to set the date setting mode. In the IC recorder 1, date can be set by pressing the return/feed button 61c. If in this state the menu/feed button 61a is pressed, the IC recorder 1 is switched to the time setting mode for displaying the time on the liquid display panel 41. The return/feed button 61c can be pressed for setting time in the IC recorder 1. Finally, the time setting mode is terminated by pressing the stop button 61e.

The IC recorder 1 can switch the display contents of audio data corresponding to the index number designated in the liquid crystal display panel 41. When the audio data is recorded in the semiconductor memory 9, the IC recorder 1 simultaneously records the recording time and date and the recording time. When the display button 61h is pressed, the program of changing the display contents displayed on the liquid crystal display panel 41 of the IC recorder 1 is read out from the ROM 31 and executed to change the display contents of the liquid crystal display panel 41. Specifically, by pressing the display button 61h, the recording date, recording time and residual recordable time are sequentially displayed on the liquid crystal display panel 41.

Figure 9:
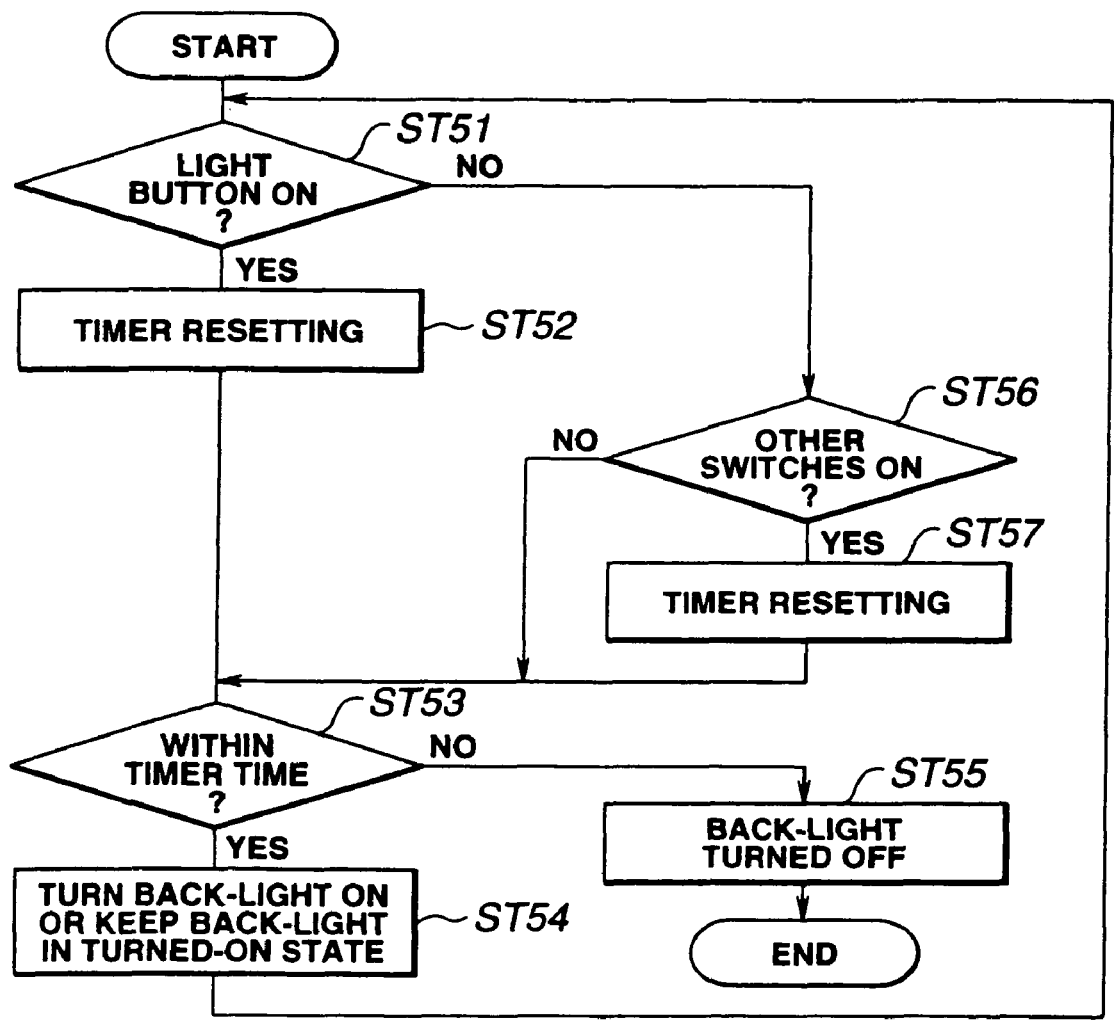
FIG. 9 is a flowchart showing the control of a back-light of the IC recorder.

If the user manipulates the IC recorder 1 in a dark environment, the back-light 42 can be lighted on the display unit 40. Referring to FIG. 9, if the light button 61g is pressed, the CPU 32 of the IC recorder 1 proceeds to step ST51 to check whether or not the light button 61g has been pressed. If the light button 61g has been pressed, processing transfers to step ST52 and, if otherwise, processing transfers to step ST56. At step ST52, the CPU 32 resets the timer 33 to start time counting. If the timer 33 is reset, processing transfers to step ST53 to judge whether or not the back-light 42 has been turned on for 10 seconds. Within 10 seconds since lighting of the back-light 42, the back-light 42 continues to be lighted, whereas, if the time of 10 seconds has lapsed, the back-light 42 is turned off at step ST55.

If at step ST54 the back-light 42 continues to be lighted, the CPU 32 reverts to step ST51 to judge whether or not the light-button 61g has been pressed. If the CPU 32 finds that the light-button 61g has not been pressed, processing transfers to step ST56. At step ST56, the CPU 32 judges whether or not any one of the pushbuttons 61 of the timer 33 has been pressed with the back-light 42 in the lighted state. If, at step ST57, the CPU 32 finds that any one of the pushbuttons 61 of the timer 33 has been pressed, with the back-light 42 in the lighted state, the CPU 32 again resets the timer 33 to start time counting. If none of the pushbuttons 61 has been pressed, processing again reverts to step ST53. At step ST53, it is judged whether or not the back-light 42 has been turned on for 10 seconds as counted by the timer 33. Within 10 seconds as from lighting, the lighted state is maintained, whereas, if the time of 10 seconds has elapsed, the back-light 42 is turned off at step ST5.

In the foregoing decryption, it is assumed that the timer 33 is reset if all of the pushbuttons 61 have been pressed. It is of course possible to limit the pushbuttons to those required to be operated as the user checks the display contents of the liquid crystal display panel 41, such as those for reproducing or recording operations. Since the timer 33 is not reset in this case on pressing the irrelevant pushbuttons 61, the back-light 42 is turned off in 10 seconds thus preventing wasteful power consumption.

With the IC recorder 1, if pre-set pushbuttons 61 are pressed during lighting of the back-light 42, the timer 33 is reset. Thus, if the user manipulates as the or she checks the liquid crystal display panel 41 in the dark, the back-light 42 is always in the lighted state. Since the timer of the IC recorder 1 is reset every 10 seconds, it becomes possible to prevent the back-light 42 from continuing to be lighted inadvertently.

Although the foregoing description has been made in connection with the IC recorder according to the present invention, the present invention can naturally be applied to a small-sized electronic equipments having excellent portability, such as a recording and/or reproducing apparatus having a disc cartridge as a recording medium because the small-sized electronic equipments can be carried easily and hence manipulated frequently by the user in the dark. The recorded data is not limited to audio data but may also be dynamic data, such as moving picture data.

What is claimed is:

1. A recording and/or reproducing apparatus comprising:
   storage means for storing a plurality of digital audio programs;
   selecting means for selecting a digital audio program from said plurality of digital audio programs stored in said storage means;
   reproducing means for reproducing said selected digital audio program;
   erasure directing means for directing an erasure of said selected digital audio program being reproduced; and
   control means for erasing an entirety of said selected digital audio program being reproduced by said reproducing means from said plurality of stored digital audio programs on condition that said erasure directing means directs erasure of said reproduced digital audio program a second time during reproduction of said selected digital audio program subsequent to directing erasure of said digital audio program a first time during reproduction of said selected digital audio program.

2. The recording and/or reproducing apparatus as claimed in claim 1, wherein said control means operates so that, when said digital audio program being reproduced from said storage means is shorter than a pre-set value, said digital audio program being reproduced from said storage means is reproduced in its entirety from said storage means.

3. The recording and/or reproducing apparatus as claimed in claim 2 wherein said control means operates so that if, when said digital audio program stored in said storage means is being reproduced therefrom, and said erasure directing means directs erasure of said reproduced digital audio program, said digital audio program being reproduced from said storage means is reproduced a pre-set amount of time from an end of said reproduced digital audio program.

4. The recording and/or reproducing apparatus as claimed in claim 1, wherein said control means operates so that, if said digital audio program being reproduced from said storage means is longer than a pre-set value, a leading portion and a trailing portion of said digital audio program being reproduced from said storage means are reproduced from said storage means.

5. The recording and/or reproducing apparatus as claimed in claim 1, wherein said control means operates so that when said digital audio program stored in said storage means is being reproduced and said erasure directing means directs erasure of said digital audio program being reproduced, the erasure operation is discontinued if, after said digital audio program being reproduced from said storage means is reproduced for a pre-set amount of time and said erasure directing means no longer directs erasure of said digital audio program being reproduced.

6. The recording and/or reproducing apparatus as claimed in claim 1, further comprising: display means and illumination means for illuminating said display means based on an input from said erasure directing means, said control means operating said illuminating means for a pre-set time based on an input from said erasure directing means for illuminating said illuminating means.

7. The recording and/or reproducing apparatus as claimed in claim 6 wherein said control means includes a timer started based on an input from said erasure directing means for initiating measurement of the lighting time of the illuminating means.

8. The recording and/or reproducing apparatus as claimed in claim 7 wherein, if said input for initiating measurement is again entered during measurement of the lighting time for said pre-set time, said timer re-measures the lighting time of the illuminating means as from the time said input is again entered.

9. The recording and/or reproducing apparatus as claimed in claim 1, further comprising: a digital/analog converter for converting the digital audio program read out from the storage means into an analog signal.

10. The recording and/or reproducing apparatus as claimed in claim 1, wherein said storage means is a semiconductor memory.

11. The recording and/or reproducing apparatus as claimed in claim 1, wherein said control means controls erasing of a particular digital audio program stored in said storage means when input is entered to said erasure directing means directing erasure of said digital audio program after said input directing erasure is entered during reproduction of said particular digital audio program from said storage means.

12. A recording/reproducing apparatus as claimed in claim 1, wherein said control means is operable to erase said entirety of said reproduced digital audio program regardless of a position within said digital audio program at which said digital audio program is being reproduced when said erasure directing means directs erasure of said reproduced digital audio program the second time.

13. A recording and/or reproducing apparatus comprising:
storage operable to store a plurality of digital audio programs; and
a reproducing unit operable to reproduce a digital audio program selected from said plurality of stored digital audio programs,
said recording and/or reproducing apparatus being operable to erase an entirety of said selected digital audio program being reproduced by said reproducing unit from said plurality of stored digital audio programs on condition of receiving a user input a second time during reproduction of said selected audio program subsequent to receiving the user input a first time during reproduction of said selected audio program, the user input directing erasure of said selected digital audio program.

14. A recording/reproducing apparatus as claimed in claim 13, wherein said recording and/or reproducing apparatus is operable to erase said entirety of said reproduced digital audio program regardless of a position within said digital audio program at which said digital audio program is being reproduced when the user input is received the second time directing erasure of said reproduced digital audio program.

15. The recording and/or reproducing apparatus as claimed in claim 13, wherein when said digital audio program being reproduced from said storage is shorter than a pre-set value, said reproduced digital audio program is reproduced in its entirety.

16. The recording and/or reproducing apparatus as claimed in claim 15 wherein when said digital audio program stored in said storage is being reproduced therefrom, and said reproduced digital audio program is directed to be erased by the user input, said digital audio program being reproduced from said storage is reproduced a pre-set amount of time from an end of said reproduced digital audio program.

17. The recording and/or reproducing apparatus as claimed in claim 13, wherein if said digital audio program being reproduced from said storage is longer than a pre-set value, a leading portion and a trailing portion of said digital audio program being reproduced from said storage are reproduced from said storage.

18. The recording and/or reproducing apparatus as claimed in claim 13, wherein when said digital audio program stored in said storage is being reproduced and is directed to be erased by the user input, the erasure operation is discontinued if, after said digital audio program being reproduced from said storage is reproduced for a pre-set amount of time and the user input no longer directs erasure of said digital audio program being reproduced.

19. The recording and/or reproducing apparatus as claimed in claim 13, further comprising: a digital/analog converter for converting the digital audio program read out from said storage into an analog signal.

20. The recording and/or reproducing apparatus as claimed in claim 13, wherein said storage is a semiconductor memory.

21. The recording and/or reproducing apparatus as claimed in claim 13, further comprising: a display and illumination configured to illuminate said display based on the user input directing erasure, said illumination being operable for a pre-set time in response to the user input.

22. The recording and/or reproducing apparatus as claimed in claim 21 further comprising a timer started based on an input for initiating measurement of the lighting time of the illumination.

23. The recording and/or reproducing apparatus as claimed in claim 22 wherein, if said input for initiating measurement is again entered during measurement of the lighting time for said pre-set time, said timer re-measures the lighting time of the illumination from the time said input is again entered.

24. A recording and/or reproducing method comprising:
a) storing a plurality of digital audio programs;
b) selecting a digital audio program from said plurality of stored digital audio programs;
c) reproducing said selected digital audio program; and
d) erasing an entirety of said selected digital audio program being reproduced from said plurality of stored digital audio programs on condition of receiving a user input directing erasure of said reproduced digital audio program, the user input being received a first time and a second time subsequent to the first time, each of the first and second times occurring while said selected digital audio program is being reproduced in step (c).

25. A recording and/or reproducing method as claimed in claim 24, wherein said entirety of said reproduced digital audio program is erased regardless of a position within said digital audio program at which said digital audio program is being reproduced when said user input directing erasure of said reproduced digital audio program is received the second time.

\* \* \* \* \*